United States Patent
Vacanti

(10) Patent No.: US 7,295,151 B2
(45) Date of Patent: Nov. 13, 2007

(54) SYSTEMS AND METHODS FOR SELF-TEST OF A RADAR ALTIMETER

(75) Inventor: David C. Vacanti, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 197 days.

(21) Appl. No.: 11/306,185

(22) Filed: Dec. 19, 2005

(65) Prior Publication Data
US 2007/0139259 A1   Jun. 21, 2007

(51) Int. Cl.
G01S 7/40  (2006.01)
G01S 13/32  (2006.01)

(52) U.S. Cl. ............... 342/173; 342/121; 342/122
(58) Field of Classification Search ............ 342/173
See application file for complete search history.

(56) References Cited

U.S. PATENT DOCUMENTS

| | | | |
|---|---|---|---|
| 4,503,433 A * | 3/1985 | Tomasi | 342/87 |
| 5,151,661 A * | 9/1992 | Caldwell et al. | 327/107 |
| 5,160,933 A | 11/1992 | Hager | |
| 5,673,050 A * | 9/1997 | Moussally et al. | 342/22 |
| 5,821,897 A * | 10/1998 | Bradley | 342/165 |
| 7,023,378 B2 * | 4/2006 | Coleman et al. | 342/174 |
| 2005/0156781 A1 * | 7/2005 | Coleman et al. | 342/174 |
| 2007/0081611 A1 * | 4/2007 | Fudge et al. | 375/316 |
| 2007/0139259 A1 * | 6/2007 | Vacanti | 342/173 |
| 2007/0192391 A1 * | 8/2007 | McEwan | 708/271 |

* cited by examiner

Primary Examiner—Thomas H. Tarcza
Assistant Examiner—Shelley Chen
(74) Attorney, Agent, or Firm—Black Lowe & Graham PLLC

(57) ABSTRACT

Systems and methods for testing a signal generated by a Direct Digital Synthesizer (DDS) in a radar altimeter. In an embodiment of the method, a voltage signal derived by comparing a fixed reference frequency to a ramped frequency signal generated by the DDS based on a clock-based reference signal is generated. The generated voltage signal is integrated over a predefined range of clock signals. The integration is sampled at a previously defined clock tick. The sample is compared to a desired value and an indication that the radar altimeter is malfunctioning is provided if the comparison exceeds a predefined threshold value. The radar altimeter system is deactivated if an indication that the radar altimeter is malfunctioning has been provided.

11 Claims, 5 Drawing Sheets

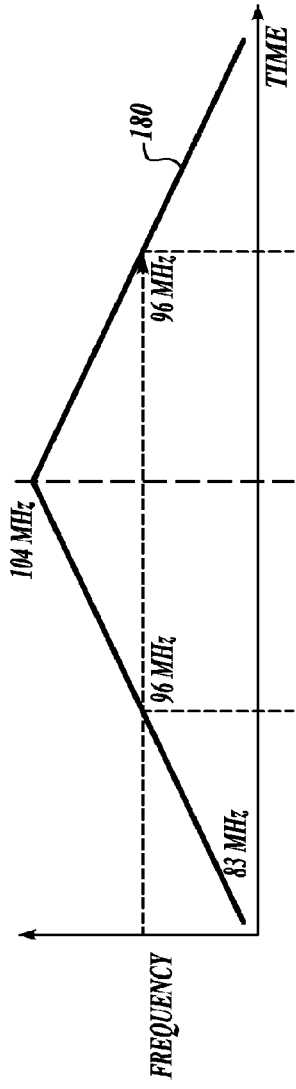
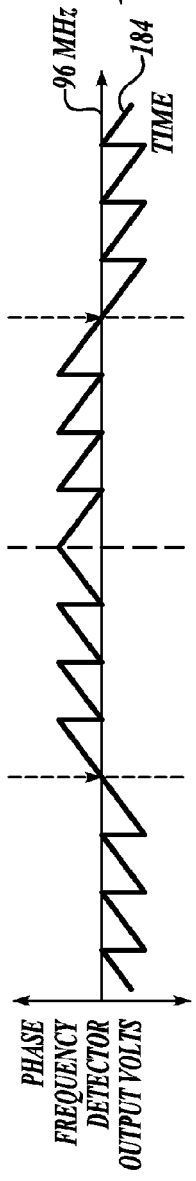
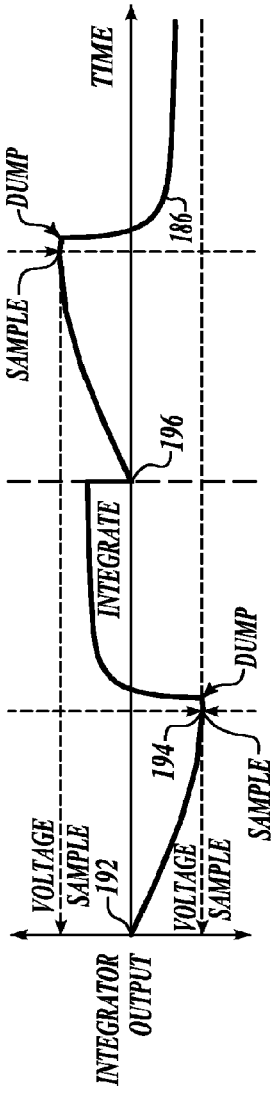
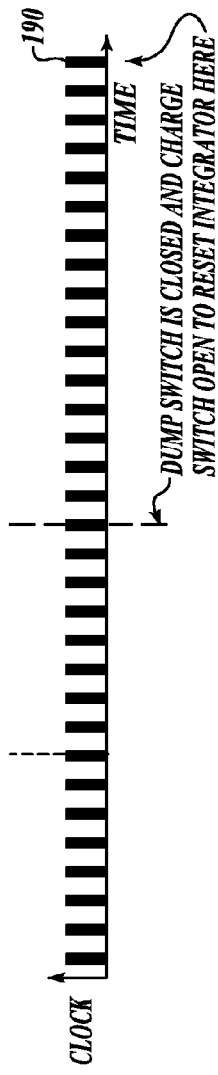

SYSTEMS AND METHODS FOR SELF-TEST OF A RADAR ALTIMETER

CROSS-REFERENCE TO RELATED APPLICATIONS

This application is related to co-pending U.S. patent application Ser. No. 11/306,185. The contents of which are hereby incorporated by reference.

BACKGROUND OF THE INVENTION

Frequency Modulated/Continuous Wave (FM/CW) Radar Altimeters need ways in which to verify proper operation. In current radar altimeters, self-testing is performed in a system that uses a Bulk Acoustic Wave (BAW) device that is relatively expensive. These systems fail to accurately detect improper system operation.

Therefore, there exists a need to replace expensive BAW devices and to implement a self-test that more effectively identifies when the radar altimeter is performing outside of acceptable limits.

BRIEF SUMMARY OF THE INVENTION

The present invention provides systems and methods for testing a signal generated by a Direct Digital Synthesizer (DDS) in a radar altimeter. In an embodiment of the method, a voltage signal derived by comparing a fixed reference frequency to a ramped frequency signal generated by the DDS based on a clock-based reference signal is generated. The generated voltage signal is integrated over a predefined number of clock signals. The integration is sampled at a previously defined clock tick. The sample is compared to a desired value and an indication that the radar altimeter is malfunctioning is provided if the comparison exceeds a predefined threshold value.

The radar altimeter system is deactivated if an indication that the radar altimeter is malfunctioning has been provided.

BRIEF DESCRIPTION OF THE SEVERAL VIEWS OF THE DRAWING

The preferred and alternative embodiments of the present invention are described in detail below with reference to the following drawings.

FIGS. 4A-D illustrate timing diagrams of signals produced by some of the components shown in FIG. 3.

DETAILED DESCRIPTION OF THE INVENTION

Figure 1:
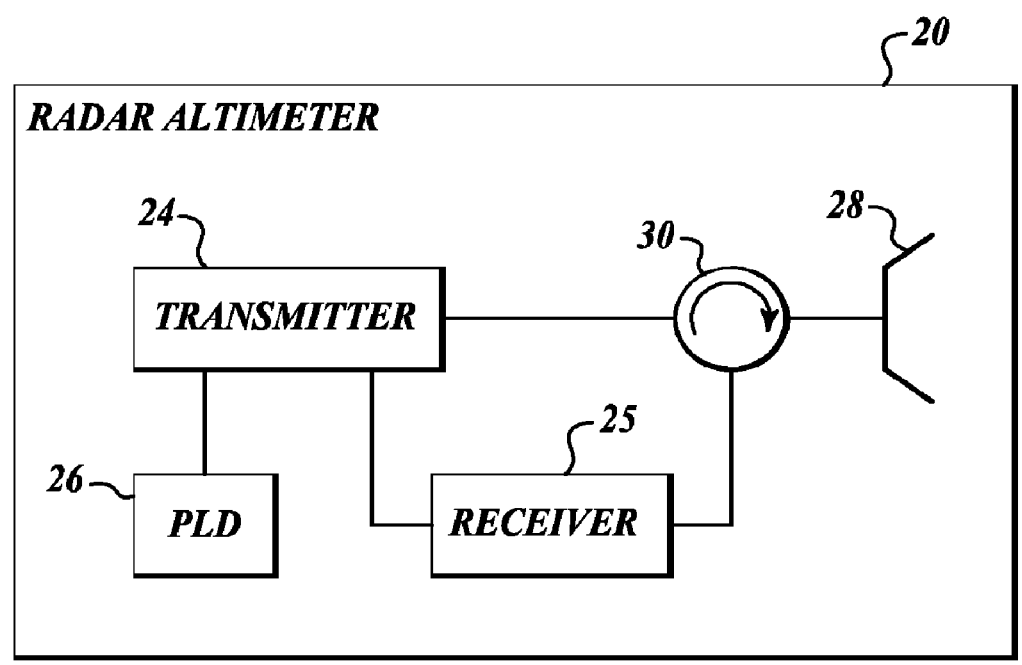
FIG. 1 is a block diagram of an example radar altimeter formed in accordance with the present invention.

FIG. 1 illustrates an example radar altimeter 20 for performing self-tests of the component of a transmission signal. The radar altimeter 20 includes a transmitter 24 coupled to a Programmable Logic Device (PLD) 26 and a receiver 25, both coupled to an antenna 28 via circulator 30. The transmitter 24 or the PLD 26 performs self-testing during normal transmit and receive mode of operation of the radar altimeter 20. The radar altimeter 20 will go off-line if it is determined that during self-testing certain components of the transmission signal are out of limits.

Figure 2:
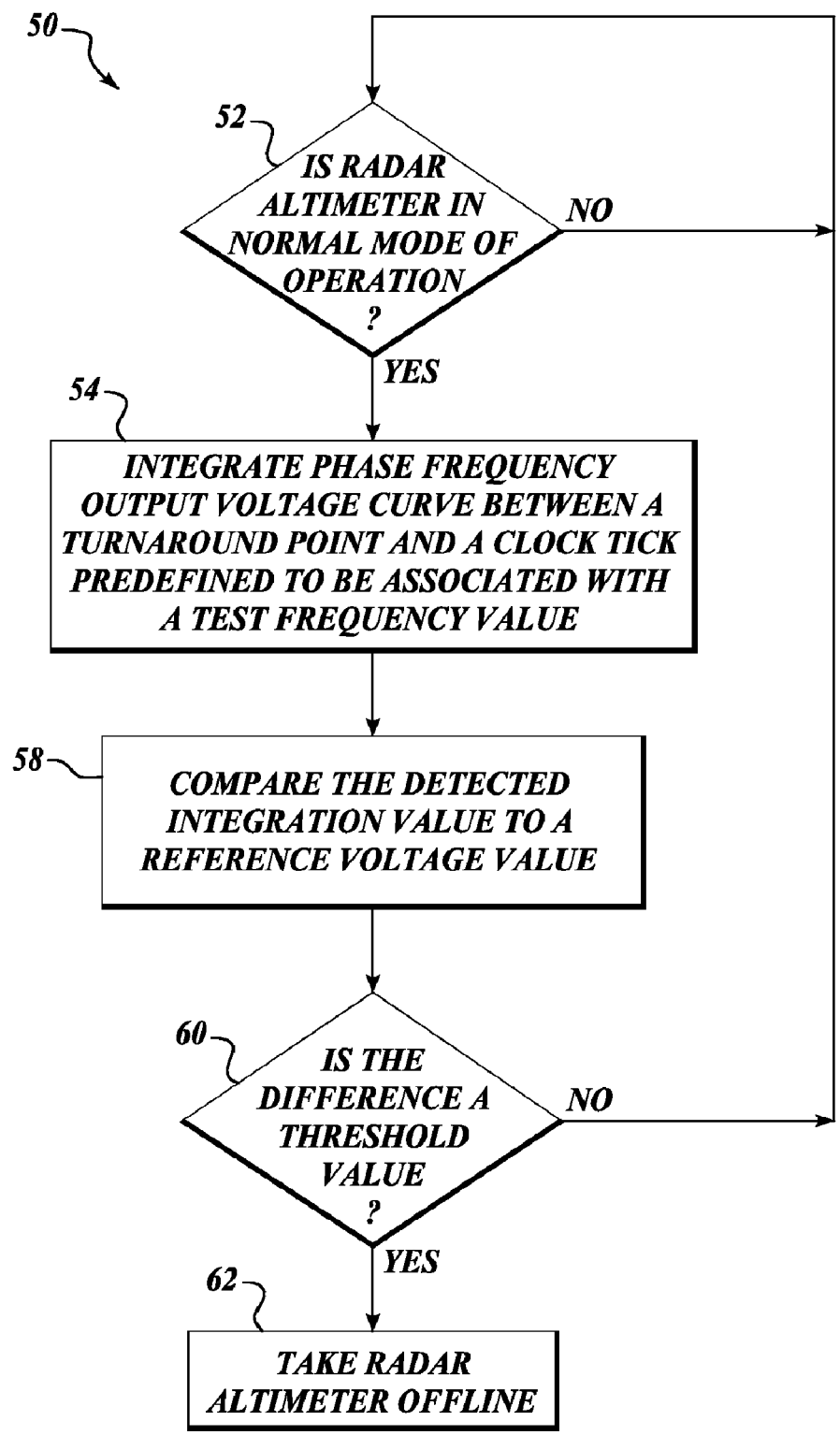
FIG. 2 is a flow diagram of an example process performed by the system shown in FIG. 1.

FIG. 2 illustrates a flow diagram of an example process 50 performed by components of the transmitter 24 and/or the PLD 26. The process 50 begins at decision block 52. At the decision block 52, the process 50 determines if the radar altimeter 20 is in the normal mode of operation. The radar altimeter 20 is in the normal mode of operation when the aircraft is airborne and within a certain altitude above the ground. If the radar altimeter 20 is determined not to be in the normal mode of operation, the process 50 returns to decision block 52 until the radar altimeter 20 is determined to be in the normal mode of operation, at which time the process 50 continues to a block 54. At the block 54, an integration of a phase/frequency output voltage curve between a turnaround point and a clock tick that is predefined to be associated with a test frequency value is performed. Next, at a block 58, the process 50 compares the detected integration value to a reference voltage value. At a decision block 60, the process 50 determines if the difference as determined at block 58 is greater than a threshold value. If the difference is not greater than the threshold value, the process 50 returns to the decision block 52. If the difference was determined to be greater than the threshold value, then the process 50 takes the radar altimeter 20 off-line at a block 62.

Figure 3:
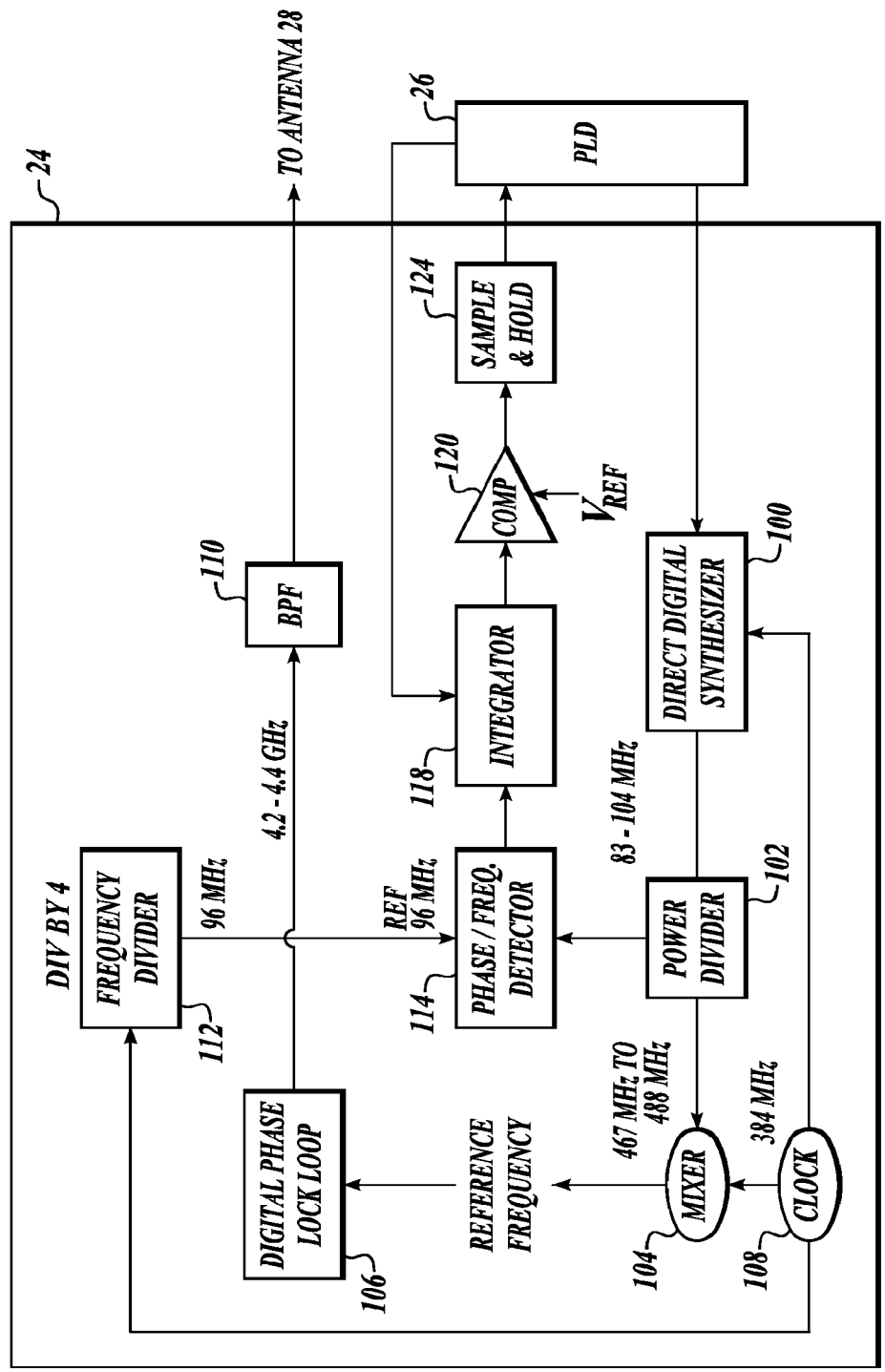
FIG. 3 illustrates components of the system shown in FIG. 1.

FIG. 3 illustrates an embodiment of the transmitter 24 from FIG. 1. In this embodiment, the transmitter 24 includes a Direct Digital Synthesizer (DDS) 100, a power divider 102, a mixer 104, a digital phase lock loop 106, a clock 108, a frequency divider 112, a phase/frequency detector 114, an integrator 118, a Band Pass Filter (BPF) 110, a comparator 120, and a sample and holding device 124. During the normal mode of operation, the DDS 100 generates a signal, such as signal 180 shown in FIG. 4A, and sends it to the mixer 104. The DDS 100 receives a clock signal from the clock 108. The clock 108 also sends the clock signal to the mixer 104 and the frequency divider 112. The power divider 102 splits the signal sent from the DDS 100 and sends the split signal to the mixer 104 and the phase/frequency detector 114. The phase/frequency detector 114 also receives a signal from the frequency divider 112 that is a reduced frequency version of the clock signal. The mixer 104, forms a reference frequency by summing the frequency of the clock signal and the frequency of the DDS 100 and sends it to the digital phase lock loop 106. The digital phase lock loop 106 generates a radar signal by multiplying the mixer output reference frequency by an integer number and sends it through the BPF 110 for transmission via the antenna 28.

The output of the phase/frequency detector 114 is integrated by the integrator 118. The output of the integrator 118 is compared at the comparator 120 to a reference voltage Vref. The output of the comparator 120 is sent to the sample and holding device 124 that retains the sampled comparator output until it is requested by the PLD 26. This permits the PLD 26 to operate asynchronously from the transmitter 24. The comparator 120 determines if the product of the integrator 118 as compared to the Vref is outside of a threshold value as was performed at the decision block 60 from FIG. 2. The DDS 100 and the integrator 118 are controlled by the PLD 26.

FIGS. 4A-D illustrate examples of signals that are generated by the components shown in FIG. 3. FIG. 4A illustrates a signal 180 that is generated by the DDS 100 and sent to the phase frequency detector 114 by the power divider 102. FIG. 4B illustrates a signal 184 that shows output voltage values as generated by the phase frequency detector 114 when the output of the frequency divider 112 is used as a reference frequency.

FIG. 4C illustrates a curve 186 that is the output of the integrator 118. The curve 186 is the integration of the signal 184 as shown in FIG. 4B. FIG. 4D illustrates a pulse signal 190 that is the clock pulse signal generated by the clock 108.

Figure 5:
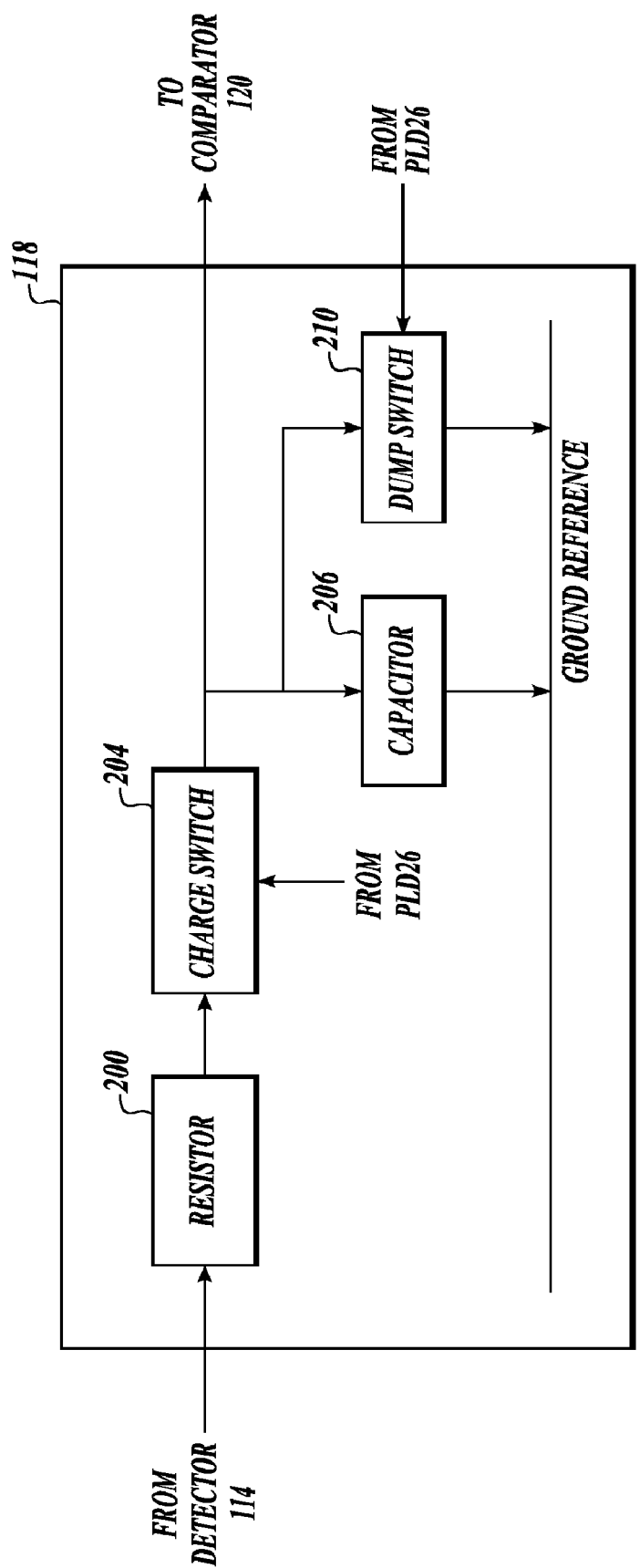
FIG. 5 illustrates exemplary details of one of the components shown in FIG. 3.

Referring now to FIG. 5 with reference back to FIGS. 4A-D and FIG. 3. FIG. 5 illustrates an embodiment of the integrator 118. In this embodiment, the integrator 118 includes a resistor 200, a charge switch 204, a capacitor 206, and a dump switch 210. The signal 184 generated by the detector 114 is received at the resistor 200. When the charge switch 204 is closed and the dump switch 210 is open, the resistor and capacitor together form a integration circuit with a time constant that is determined by the product of the resistance in ohms and the capacitance in farads. The resistor effectively slows the rate at which the capacitor is charged or discharged by the polarity of the signal arriving at the input to resistor 200. The charge switch 204 and the dump switch 210 are both controlled by the PLD 26. The capacitor 206 and the dump switch 210 are coupled between the output of the charge switch 204 and a ground reference.

Referring back to FIG. 4C, at a point 192 (the initialization point), the charge switch 204 is closed and the dump switch 210 is in the open position. This causes the capacitor 206 to charge up based on the received signal from the detector 114. At N-clock ticks, point 194, the charge switch 204 is put in the open position and the dump switch 210 remains in the open position. The N-clock ticks point 194 is the clock tick at which it was previously determined to be the point in time at which the DDS curve 180 hits 96 MHz. At this point the output of the comparator 120 is sampled by the sample and hold circuit 124 and retained for use by the PLD 26. One clock tick after the sample circuit 124 has sampled the comparator 120 output, the dump switch 210 is closed and the capacitor voltage is discharged to zero for 1-2 clock ticks. Then the dump switch 210 is opened and the charge switch 204 is closed and the resistor 200 and the capacitor 206 resume behaving as an integrator for the second half of the DDS frequency sweep. At point 196, the charge switch 204 is opened and the dump switch 210 is retained in the open position. The sample and hold circuit 124 samples the output of the comparator 120 and retains the result for the PLD 26. One clock tick later the dump switch 210 is closed and the capacitor 206 is discharged, thus performing a reset function.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A radar altimeter system including a transmitter having a Direct Digital Synthesizer (DDS) and a Digital Phase Lock Loop, the system comprising:
    a first component configured to generate a voltage signal derived by comparing a fixed reference frequency to a ramped frequency signal generated by the DDS based on a clock-based reference signal;
    a second component configured to integrate the generated voltage signal over a predefined range of clock signals;
    a third component configured to sample the integration at a previously defined clock tick;
    a fourth component configured to compare the sample to a desired value; and
    a fifth component configured to provide an indication that the radar altimeter is malfunctioning if the comparison exceeds a predefined threshold value.

2. The system of claim 1, further comprising a device configured to deactivate the radar altimeter system if an indication that the radar altimeter is malfunctioning has been provided.

3. The system of claim 1, wherein the second component includes a device configured to perform a reset function.

4. A method for testing a signal generated by a Direct Digital Synthesizer (DDS) in a radar altimeter, the method comprising:
    generating a voltage signal derived by comparing a fixed reference frequency to a ramped frequency signal generated by the DDS based on a clock-based reference signal;
    integrating the generated voltage signal over a predefined range of clock signals;
    sampling the integration at a previously defined clock tick;
    comparing the sample to a desired value; and
    providing an indication that the radar altimeter is malfunctioning if the comparison exceeds a predefined threshold value.

5. The method of claim 4, further comprising deactivating the radar altimeter system if an indication that the radar altimeter is malfunctioning has been provided.

6. The method of claim 4, further comprising performing a reset function.

7. A method for testing a signal generated by a Direct Digital Synthesizer (DDS) in a radar altimeter, the method comprising:
    activating the radar altimeter in a normal mode of operation;
    integrating a generated voltage signal between a turn-around point and a clock tick;
    comparing a detected integration value to a reference voltage value; and
    deactivating the radar altimeter system if the comparison is outside a predefined threshold value.

8. The method of claim 7, wherein activating further comprises generating a voltage signal.

9. The method of claim 8, wherein generating further comprises generating the voltage signal derived by comparing a fixed reference frequency to a ramped frequency signal generated by the DDS based on a clock based reference signal.

10. The method of claim 7, wherein comparing further comprises sampling the integration at a previously defined clock tick.

11. The method of claim 7, further comprising performing a reset function.

* * * * *